United States Patent
Dirscherl et al.

(10) Patent No.: US 11,075,324 B2
(45) Date of Patent: Jul. 27, 2021

(54) METHOD OF PRODUCING AN OUTCOUPLING ELEMENT FOR AN OPTOELECTRONIC COMPONENT AND OUTCOUPLING ELEMENT

(71) Applicant: OSRAM Opto Semiconductors GmbH, Regensburg (DE)

(72) Inventors: Georg Dirscherl, Regensburg (DE); Marcus Adam, Regensburg (DE); Guido Kickelbick, St. Ingbert (DE)

(73) Assignee: OSRAM OLED GmbH, Regensburg (DE)

( * ) Notice: Subject to any disclaimer, the term of this patent is extended or adjusted under 35 U.S.C. 154(b) by 377 days.

(21) Appl. No.: 16/334,411

(22) PCT Filed: Sep. 20, 2017

(86) PCT No.: PCT/EP2017/073807
§ 371 (c)(1),
(2) Date: Mar. 19, 2019

(87) PCT Pub. No.: WO2018/054992
PCT Pub. Date: Mar. 29, 2018

(65) Prior Publication Data
US 2019/0221722 A1 Jul. 18, 2019

(30) Foreign Application Priority Data
Sep. 22, 2016 (DE) .................. 10 2016 117 885.3

(51) Int. Cl.
*H01L 21/00* (2006.01)
*H01L 33/50* (2010.01)
(Continued)

(52) U.S. Cl.
CPC ............ *H01L 33/502* (2013.01); *C08L 83/04* (2013.01); *C09K 11/02* (2013.01); *C09K 11/025* (2013.01);
(Continued)

(58) Field of Classification Search
CPC ...... H01L 33/502; H01L 51/502; C08L 83/04; C09K 11/02; C09K 11/025; C09K 11/62; C09K 11/70
(Continued)

(56) References Cited

U.S. PATENT DOCUMENTS 9,306,110 B2 4/2016 Onicha et al.
2004/0262583 A1 * 12/2004 Lee .................. H01L 29/127
252/500

(Continued)

FOREIGN PATENT DOCUMENTS

CN 104387772 A 3/2015
CN 104755586 A 7/2015
WO 2010/126606 A2 11/2010

*Primary Examiner* — Brook Kebede
(74) *Attorney, Agent, or Firm* — DLA Piper LLP (US)

(57) ABSTRACT

A method of producing an outcoupling element for an optoelectronic component includes A) providing quantum dots each having a core made of a semiconductor material, B) applying an inorganic or a phosphonate-containing ligand shell on a respective core of the quantum dots, and C) introducing the quantum dots with the ligand shell into a matrix material, wherein introducibility of the quantum dots with the ligand shell is facilitated compared to the quantum dots produced in step A), and the outcoupling element is transparent for radiation from the red and/or IR region.

16 Claims, 5 Drawing Sheets

(51) Int. Cl.
  *C09K 11/02* (2006.01)
  *C09K 11/70* (2006.01)
  *C08L 83/04* (2006.01)
  *C09K 11/62* (2006.01)
  *C08G 77/00* (2006.01)
  *B82Y 20/00* (2011.01)

(52) U.S. Cl.
  CPC ............. *C09K 11/62* (2013.01); *C09K 11/70* (2013.01); *B82Y 20/00* (2013.01); *C08G 77/80* (2013.01); *H01L 2933/005* (2013.01); *H01L 2933/0041* (2013.01); *Y10S 438/962* (2013.01); *Y10S 977/774* (2013.01); *Y10S 977/778* (2013.01)

(58) Field of Classification Search
  USPC .......................................................... 438/116
  See application file for complete search history.

(56) References Cited

U.S. PATENT DOCUMENTS

| | | |
|---|---|---|
| 2006/0040103 A1 | 2/2006 | Whiteford et al. |
| 2010/0276638 A1 | 11/2010 | Liu et al. |
| 2015/0008393 A1 | 1/2015 | Mangum et al. |
| 2015/0085490 A1 | 3/2015 | Miller et al. |
| 2015/0284627 A1 | 10/2015 | Bohmer et al. |
| 2017/0162764 A1* | 6/2017 | Kan .................... C09K 11/703 |

* cited by examiner

A)

B)

A)

B)

C)

A)

B)

C)

D)

E)

F)

METHOD OF PRODUCING AN OUTCOUPLING ELEMENT FOR AN OPTOELECTRONIC COMPONENT AND OUTCOUPLING ELEMENT

TECHNICAL FIELD

This disclosure relates to a method of producing an outcoupling element for an optoelectronic component and an outcoupling element, in particular for an optoelectronic component.

BACKGROUND

Known outcoupling elements have insufficient outcoupling of light generated in a semiconductor chip of an optoelectronic component since large refractive index differences are present at the interface between the semiconductor chip surface and its surroundings. This problem is particularly relevant for semiconductor chips that emit radiation from the red or IR wavelength region and have InGaAlP and/or GaAs based materials that have a high refractive index of n>3. Semiconductor chips are typically embedded in a matrix material, for example, made of silicone or epoxy, having a refractive index of 1.4 to 1.55. This increases the outcoupling of the light emitted by the semiconductor chip compared to a semiconductor chip surrounded by air with a refractive index n=1. Furthermore, the matrix material acts as a barrier against environmental influences and can be formed as a lens to efficiently outcouple the radiation emitted by the semiconductor chip from the component. So far, nanoparticles such as zirconium oxide or titanium dioxide have been known as highly refractive additives for outcoupling materials. Such nanocomposites made of zirconium oxide or/and titanium dioxide and polymer matrix material have the disadvantage that they can only be applied as thin film materials and thus cannot be formed as a lens. Previously examined organically loaded zirconium oxide nanoparticles also yellow under blue light and temperature tests per se or in a matrix material, for example, made of silicone as well. In InGaAlP/GaAs, the photonic energy of the wavelengths to be used of >600 nm is not sufficient to cleave bonds of typical matrix materials, in particular thermally oxidized species thereof.

There is thus to provide an outcoupling element that efficiently outcouples radiation emitted by the semiconductor chip, an outcoupling element for an optoelectronic component and a method of producing an outcoupling element for an optoelectronic component that efficiently and simply produces an efficient outcoupling element.

SUMMARY

We provide a method of producing an outcoupling element for an optoelectronic component including A) providing quantum dots each having a core made of a semiconductor material, B) applying an inorganic or a phosphonate-containing ligand shell on a respective core of the quantum dots, and C) introducing the quantum dots with the ligand shell into a matrix material, wherein introducibility of the quantum dots with the ligand shell is facilitated compared to the quantum dots produced in step A), and the outcoupling element is transparent for radiation from the red and/or IR region.

We also provide an outcoupling element including a matrix material which is a highly refractive silicone and in which quantum dots each having a core of GaP or InP are embedded, wherein a respective core has a ligand shell of silica or phenyl-functionalized siloxane-phosphonate, and the outcoupling element is transparent to radiation from the red and/or IR region.

Figure 1:
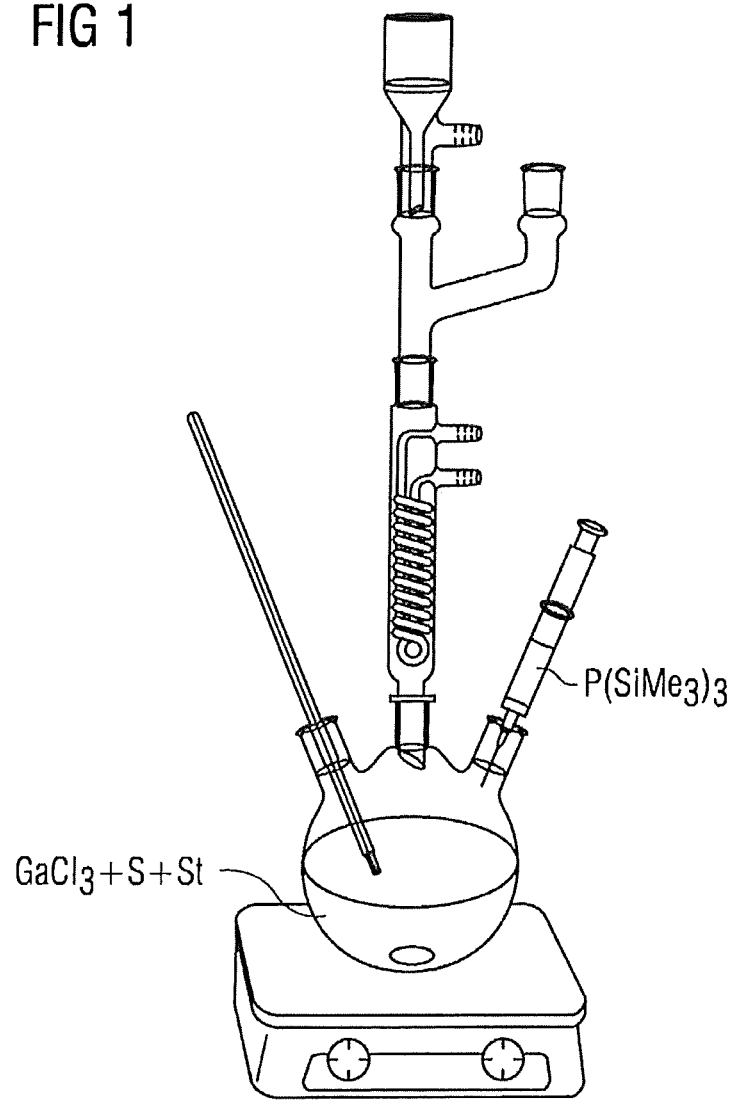
FIG. 1 shows the hot injection method.

REFERENCES 100 optoelectronic component
1 substrate
2 semiconductor chip
3 lens
4 recess
5 housing
6 casting
7 quantum dots
71 core
72 inorganic or phosphonate-containing ligand shell
73 first ligand shell
8 matrix material
9 outcoupling element
10 stabilizing reagent

DETAILED DESCRIPTION

Our method of producing an outcoupling element for an optoelectronic component may have the following steps:

A) providing quantum dots each having a core made of a semiconductor material,
B) applying an inorganic or a phosphonate-containing ligand shell on the respective core of the quantum dots, and
C) introducing the quantum dots with the ligand shell into a matrix material, wherein the introducibility of the quantum dots with the ligand shell is facilitated compared to the quantum dots produced in step A), and
the outcoupling element is transparent for radiation from the red and/or IR region.

Alternatively, an organic ligand shell can be used in step B) instead of an inorganic or a phosphonate-containing ligand shell.

The method may comprise a step A), providing quantum dots. The quantum dots have a core made of a semiconductor material. The semiconductor material can be selected from a group comprising gallium phosphide (GaP), indium phosphide (InP), gallium arsenide (GaAs) and indium gallium aluminium phosphide (InGaAlP). The semiconductor material is preferably gallium phosphide or indium phosphide, particularly preferably gallium phosphide. The quantum dots are in particular transparent for radiation from the red and/or IR wavelength region. For example, gallium phosphide has a transparency with an absorption coefficient k=0 at wavelengths >500 nm. Indium phosphide has an absorption coefficient k=0.15 at a wavelength of 850 nm and an absorption coefficient k=0 at 953.7 nm. Indium phosphide nanoparticles are more easily accessible than gallium phosphide nanoparticles. Indium phosphide quantum dots would therefore be limited for the use of IR diodes having a wavelength of 950 nm.

We therefore provide a significant increase in the refractive index by embedding, for example, gallium phosphide with a refractive index of 3.314 at 633 nm or indium phosphide having a refractive index of 3.536 at 633 nm in a matrix material, for example, a polymer and at the same time a good introducibility of these quantum dots in the matrix material.

Preferably, the quantum dots are nanoparticles, i.e., particles having a size in the nanometer range with a particle diameter $d_{50}$, for example, between at least 1 nm and at most 1000 nm. Ideally, the particle diameter should not exceed approximately 1/10 of the wavelength, for example, at 600 nm a particle diameter of approximately 60 nm so that the nanoparticles have as little negative influence as possible on the transparency of the overall nanocomposite system. The quantum dots comprise a core, that is to say a semiconductor core, that can have wavelength-converting properties in the corresponding wavelength region. At wavelengths, for example, of >500 nm that is to say, for example, in the red or IR wavelength range, the core has no significant influence on the transparency of the matrix material. Transparent means a transmission of greater than 90 or 95% at least for the radiation emitted by a semiconductor chip. The semiconductor core or the core can be surrounded by one or more layers as a coating. This coating is referred to as a ligand shell, in particular as an inorganic, organic or phosphonate-containing ligand shell. In other words, the core can be completely or almost completely covered by a ligand shell on the outer surfaces or surfaces thereof.

The semiconductor core can be a monocrystalline or polycrystalline agglomerate.

The quantum dots may have an average diameter of 3 nm to 10 nm, particularly preferably 3 nm to 5 nm. The quantum dots can be formed spherical or rod-shaped. The values are, in particular, the average diameter of the core, that is to say, without a ligand shell.

The quantum dots in step A) may have a first ligand shell different from the inorganic or phosphonate-containing ligand, wherein, in step B), the first ligand shell is exchanged by the inorganic or phosphonate-containing ligand shell, and the quantum dots having the first ligand shell have a smaller refractive index than the quantum dots having the inorganic or phosphonate-containing ligand shell.

The quantum dots produced in step A) may be produced by hot injection. Preferably, in the hot injection method, a cation species can be provided in solution in a container. Subsequently, the anion species can be injected into this solution. The anion species can be added dropwise to the cation species within a so-called nucleation time of, for example, 0.5 to 1.5 s. Monomer complexes are formed. The supply of energy can be increased. A rapid saturation of the monomer complexes and thus a nucleation can be produced. Subsequently, the quantum dots can be ripened, for example, with the so-called Ostwald ripening. Temperatures of 200° C. to 350° C. can be used in the hot injection method.

The quantum dots produced in step A) may be produced by hot injection and the semiconductor material may comprise GaP.

Trioctylphosphine oxide can be added as stabilizing reagent during step A). Stabilizing reagents, also referred to as surface-active substances or surfactants, are substances that reduce the surface tension. Stabilizing reagents or surfactants are sufficiently known and are therefore not explained in more detail.

In other words, colloidal quantum dots can be produced from a reaction mixture of precursor material, solvent and optionally stabilizing by the hot injection method. The stabilizing reagents can stabilize the colloidal quantum dots by forming self-aggregated structures. The self-aggregated structures can be monolayers forming the ligand shell.

Materials selected from a group comprising thiols, amines, phosphine oxides, phosphonic acids or carboxylic acids can be used as stabilizing reagents. In particular, phosphonic acid, $RPO(OH)_2$, can be used, which, for example, has a strong binding effect to quantum dots. On the other hand, an anisotropic form of the quantum dots can be produced by the binding of the phosphonic acid to the surface of the quantum dots.

In the following, an exemplary reaction equation is shown, how colloidal GaP quantum dots can be produced by hot injection:

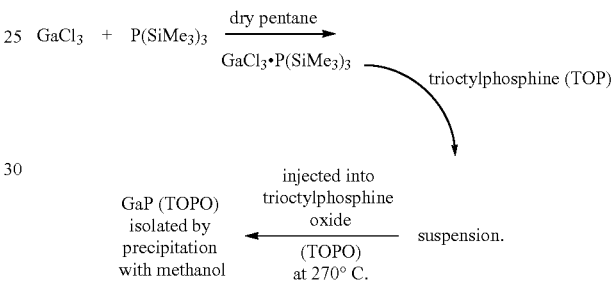

The resulting quantum dots have a first ligand shell. The first ligand shell is formed from trioctylphosphine oxide. In other words, trioctylphosphine oxide molecules attach themselves to the surface of the corresponding core of the quantum dots. However, such quantum dots are difficult to disperse into a matrix material, preferably a highly refractive silicone matrix material. This leads to the disadvantage that the introducibility of these quantum dots with the first ligand shell is more difficult. We discovered that with a ligand exchange, i.e., by exchanging the first ligand shell by an inorganic or a phosphonate-containing ligand shell, introducibility of the quantum dots into the matrix material can be facilitated. An outcoupling element can thus be produced, which is transparent for radiation from the red and/or IR region and has a high efficiency.

In a further example, quantum dots can also be produced with other stabilizing reagents such as, for example, dodecylamine (DA). In this example, production of the quantum dots can be carried out after the following reaction:

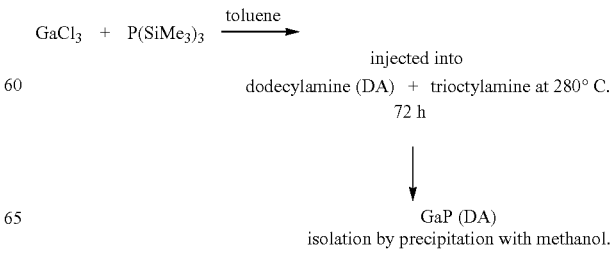

The stabilizing reagents trioctylamine and dodecylamine are deposited on the surface of the cores as the first ligand shell. However, the first ligand shell is not suitable for highly refractive polymer blends and conventional matrix materials since they have long alkyl chains and thus reduce the refractive index. In addition, only monomodal ligands can be used as stabilizing reagents. Thus, no bonding of the matrix material, for example, made of silicone is possible. The ligand shell should therefore be or be adapted to the properties of the matrix material.

The method may have a step B), applying an inorganic or a phosphonate-containing ligand shell on the respective core of the quantum dots. The quantum dots provided in step A) preferably have a first ligand shell. The first ligand shell is preferably organic, for example, of ligands containing oleic acid arranged on the surface of the core of the quantum dots. Subsequently, the first ligand shell can be exchanged by an inorganic or a phosphonate-containing ligand shell. As a result, the quantum dots can be introduced more easily into a matrix material. This can be explained in particular by the surface compatibility between matrix material and inorganic or phosphonate-containing ligand shell.

We recognized that, due to the wavelength region considered here, quantum dots with a higher refractive index than, for example, $ZrO_2$ and $TiO_2$ systems can be used. The surfaces of the quantum dots can be selectively modified so that the incorporation or introducibility of the modified quantum dots into a matrix material, for example, made of silicone is made possible.

The first ligand shell can be exchanged by an inorganic ligand shell. In the simplest example, this is groups like OH or $NH_2$. Alternatively, the ligands can also consist of an organic linker (for example, alkoxy, PDMS or the like) with OH or $NH_2$ as terminal groups. This terminal functionality of the ligands allows the encapsulation in silica and the easy embedding into the matrix material in a further synthesis step.

The first ligand shell can also be exchanged by a phosphonate-containing ligand shell. Phosphonate groups have a very high binding affinity to the anionic gallium phosphide or indium phosphide quantum dot. Terminal phosphonate ligands can therefore exchange the synthetically accessible and typical surface ligands, i.e., quantitatively displace them. The aim is a introducibility of the quantum dots with core and inorganic or phosphonate-containing ligand shell into a matrix material, which is preferably a polyorganosiloxane, in particular polydimethyl-siloxane or better the higher refractive poly-methyl-phenyl-siloxane (both used today), particularly preferably an even higher refractive polydiphenylsiloxane. To adjust a surface loading of the quantum dots compatible with a matrix material, for example, a polydiphenylsiloxane, for example, phenylsiloxane, phosphonate ligands (more easily accessible also methylsiloxane phosphonate ligands) can be bonded to the core of the quantum dots.

The method may have a step C), introducing the quantum dots with the ligand shell into a matrix material. In particular, by the ligand exchange of the quantum dots produced in step A) with a ligand shell having inorganic or phosphonate-containing ligands, embedding the quantum dots into the matrix material can be carried out more easily compared to quantum dots conventionally produced by the hot injection method having an organic first ligand shell different from the inorganic or phosphonate-containing ligand shell.

The proportion of the quantum dots in the matrix material may be between 15 vol % to 40 vol %, in particular 20 vol % to 35 vol %, for example, 13 vol % or 26 vol %. The latter values are not to be interpreted as restrictive.

We also recognized that by surface modification of the quantum dots, the refractive index, for example, of GaP can be reduced from 3.3 to 3. By embedding these modified quantum dots into a matrix material, for example, of siloxane, with a proportion of 26 vol % or 13 vol %, the refractive index can ultimately be set to 2 to 1.8. The high refractive index of the quantum dots can thus be specifically adapted to the matrix material. On the one hand, miscibility can be improved and, on the other hand, the boundary surface total reflection (NP matrix) can be minimized.

The quantum dots having the first ligand shell may have a smaller refractive index than the quantum dots having the inorganic or phosphonate-containing ligand shell.

The refractive index of the quantum dots having the inorganic or phosphonate-containing ligand shell may be higher than the refractive index of the matrix material.

In conventional outcoupling elements, scattering particles or outcoupling materials such as zirconium dioxide or titanium dioxide that are supposed to have a high refractive index, are specifically introduced. In contrast, we recognized that the outcoupling efficiency of the optoelectronic component can be increased. In particular, an efficiency gain of 20 to 50% can be achieved. Such optoelectronic components are therefore preferably suitable for greenhouse lighting. On the other hand, conventional optoelectronic components such as, for example, laser diodes or light-emitting diodes can also be used.

The inorganic ligand shell may have a terminal OH group or $NH_2$ group and the quantum dots may be embedded in silica prior to step C). In particular, the OH or $NH_2$ groups are bonded to the surface of the core of the quantum dots.

The phosphonate-containing ligand shell may have a terminal phenyl-functionalized siloxane phosphate covalently bonded to the core of the quantum dots.

The ligand exchange of the first ligand shell in an inorganic ligand shell may be carried out. The quantum dots are preferably produced by hot injection. The quantum dots then have a first ligand shell, which is preferably organic. This organic first ligand shell is exchanged by an inorganic ligand shell, in particular according to the HSAB principle. Gallium ions are, for example, hard, while OH ions are soft. Subsequently, the encapsulation of these modified quantum dots in silica can be carried out and their introducibility into a matrix material can be increased. There is no significant reduction in the refractive index since no long alkyl radicals are present. The ligand shells provide a barrier against environmental influences and ensure good introducibility of the quantum dots into the matrix material having, for example, a refractive index of 1.53.

Alternatively, the first ligand shell of the quantum dots provided in step A) can be exchanged by a phosphonate-containing ligand shell. For example, the first ligand shell can contain oleic acid and be displaced by phosphonate ligands. In particular, the phosphonate ligands are phenyl-functionalized siloxane phosphonate ligands. The refractive index of the phenyl-functionalized siloxane phosphonate ligands corresponds essentially to the refractive index of the matrix material so that an easy introducibility of the modified quantum dots into the matrix material can therefore be achieved and no scattering occurs at the interfaces.

The quantum dots in step A) may be produced by direct hot injection, wherein $Ph_3Si$-PDPS (Ph=Phenyl; PDPS=polydiphenylsiloxane) is added as stabilizing reagent. Alternatively, since it is easier to access, the PDMS analogue is currently being used, i.e., PDMS phosphate (PDMS=polydimethylsiloxane) with different PDMS chain lengths, for example, with 5 kD and 10 kDa:

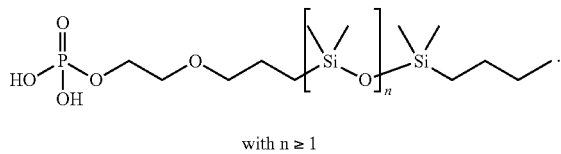

with n ≥ 1

We further recognized that, in addition to the ligand exchange, phenylsiloxane phosphonate ligands or currently the PDMS phosphate shown above can also be used directly as a stabilizing reagent in the hot injection synthesis and form the phosphonate-containing ligand shell. Thus, no ligand exchange has to be carried out and the incorporation or introducibility into a matrix material is easier compared to quantum dots that are produced in step A) of the method.

Production of the outcoupling element and the quantum dots may be carried out by direct hot injection with triphenylsiliconpolydiphenylsiloxane phosphonate or correspondingly. In particular, no trioctylphosphine oxide (TOPO) is used. These phenylsiloxane ligands have a similar refractive index or substantially the same refractive index as the refractive index of the matrix material so that these are compatible with one another.

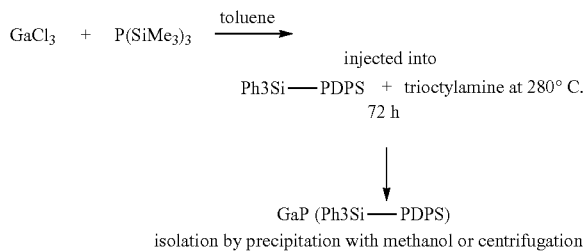

The outcoupling efficiency, preferably of the radiation emitted by a semiconductor chip, can be increased by the outcoupling element described here.

We further provide an outcoupling element. The outcoupling element is preferably produced using the method described above.

The outcoupling element have a matrix material that is a highly refractive silicone. In particular, a silicone having a refractive index n>1.53 is described as a highly refractive silicone. Quantum dots are embedded in the matrix material. The quantum dots each have a core made of gallium phosphide or indium phosphide. The respective core has a ligand shell made of silica or phenyl-functionalized siloxane phosphonate. This ligand shell facilitates the introducibility of the quantum dots into the matrix material compared to quantum dots that do not have such a ligand shell or have a ligand shell, for example, of oleic acid. The outcoupling element is transparent for radiation from the red and/or IR region.

Radiation from the red region means a wavelength of approximately 600 to 780 nm, for example, 660 nm (hyper RED) or 730 (far red). Furthermore, due to their absorption or transparency, the GaP nanoparticles can also be used steplessly for, for example, green (approx. 540 nm) and yellow (approx. 590) or all relevant color shades. Radiation from the IR region means a wavelength of 750 to 2000 nm, in particular 800 to 950 nm.

The quantum dots with the core and the ligand shell may have formula:

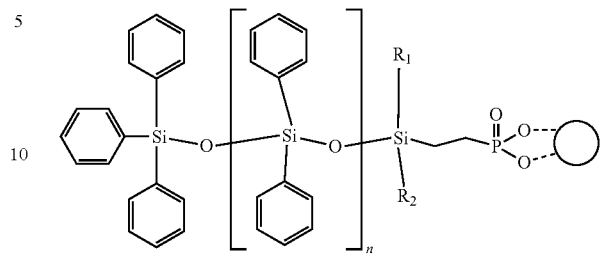

wherein n>1, R1 and/or R2 are independently from one another H, alkyl or aryl, in particular methyl.

Alternatively, the ligand shell of the quantum dots has the structural formula:

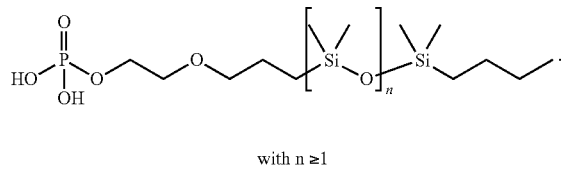

with n ≥1

Further advantages and developments result from the examples described in the following in conjunction with the figures.

In the examples and figures, identical, similar or identically acting elements can in each instance be provided with the same reference symbols. The elements illustrated and their size relationships among one another are not to be regarded as true to scale. Rather, individual elements such as, for example, layers, components, devices and regions, are represented with an exaggerated size for better representability and/or understanding.

Figure 2:
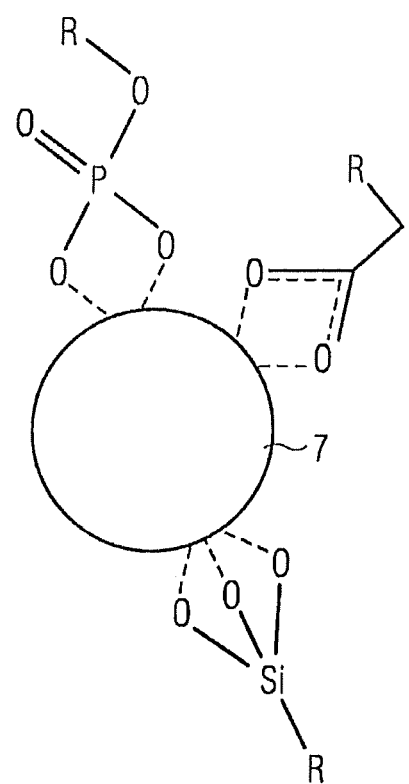
FIGS. 2A and 2B each show quantum dots having a first or second ligand shell according to an example.
Figure 2:
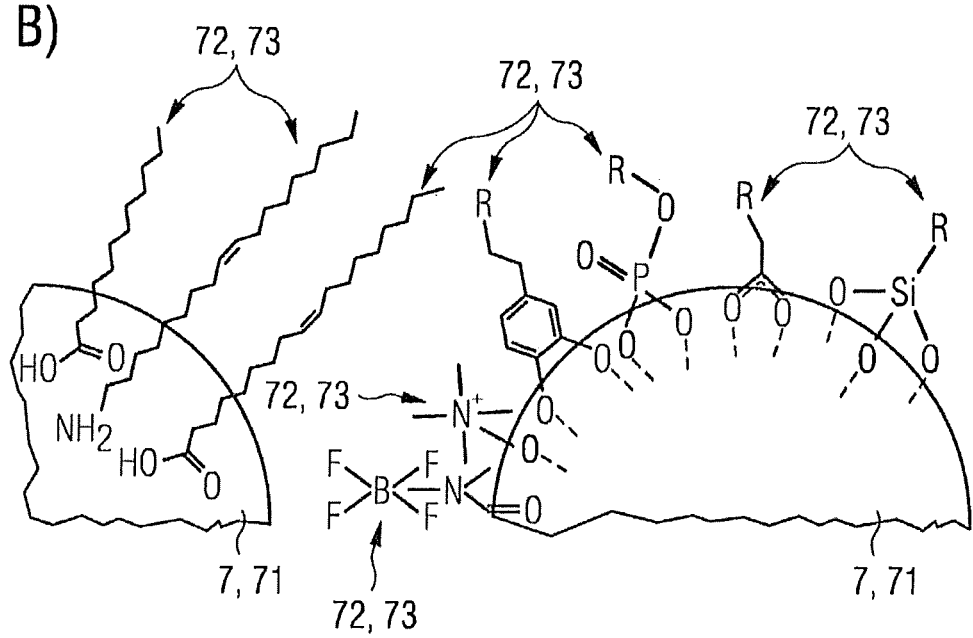

FIG. 1 shows a method of producing an outcoupling element according to an example. The hot injection method is shown. In this example, a cation species in solution, using the example of $GaCl_3$, is provided and the anion species, using the example of $P(SiMe_3)_3$, is injected, wherein a monomer complex is formed (S=solvent, St—stabilizer). With the injection, the nucleation takes place, i.e., with supply of energy, a rapid saturation of the monomer complexes is achieved so that formation of nucleation sides takes place. The energy can be supplied, for example, by heating at a temperature of approximately 150 to 400° C., for example, 250° C. The quantum dots can subsequently ripen. The ripening can be carried out after the so-called Ostwald ripening. This results in quantum dots having a core of a semiconductor material. In addition, the quantum dots have a first ligand shell. The first ligand shell can have, for example, oleic acid, lauric acid or olioylamines as shown in FIGS. 2A and/or 2B. The first ligand shell, however, has a low miscibility or introducibility into a matrix material, for example, made of silicone. We recognized that due to the ligand exchange, that is to say the exchange of the first ligand shell by an inorganic or a phosphonate-containing ligand shell, the introducibility of the quantum dots can be increased.

FIGS. 2A and 2B each show quantum dots with a first ligand shell and/or a second ligand shell. The ligands of the corresponding ligand shells could be, for example, phosphonate ligands, silane-based ligands, carboxylate ligands, phosphate-based ligands, catechol-based ligands, tetramethylammonium hydroxide-based ligands, oleic acid ligands, olioamines or lauric acid-based ligands. These ligands are arranged on the surface of the quantum dots 7.

Figure 3:
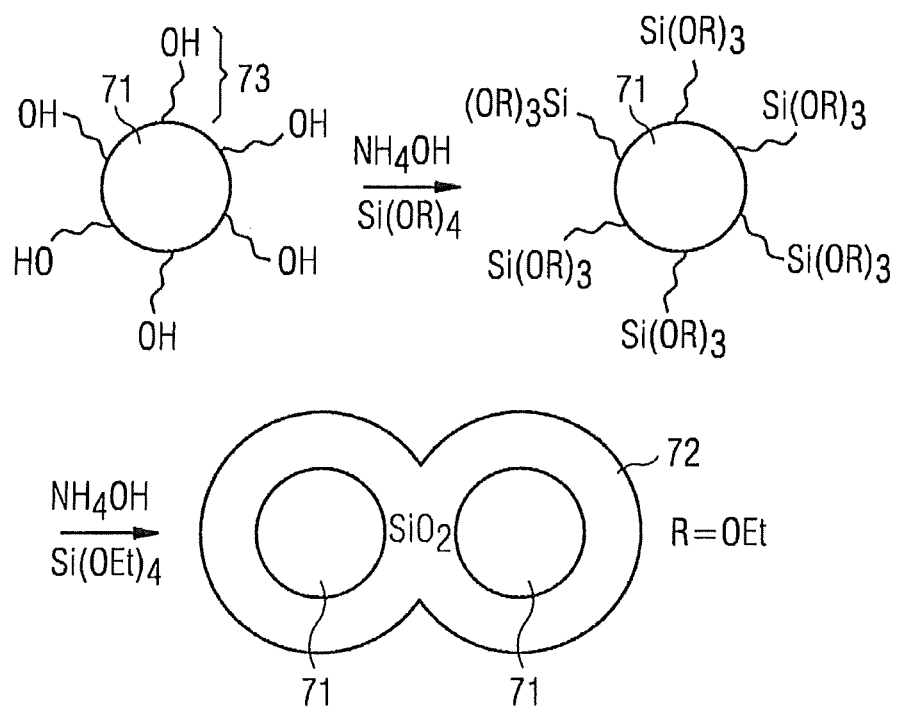
FIG. 3A shows a method of producing an encapsulation element according to an example, normally, these "encapsulation elements" can additionally be mixed into a polymeric matrix.
FIGS. 3B and 3C each show quantum dots according to one example.
Figure 3:
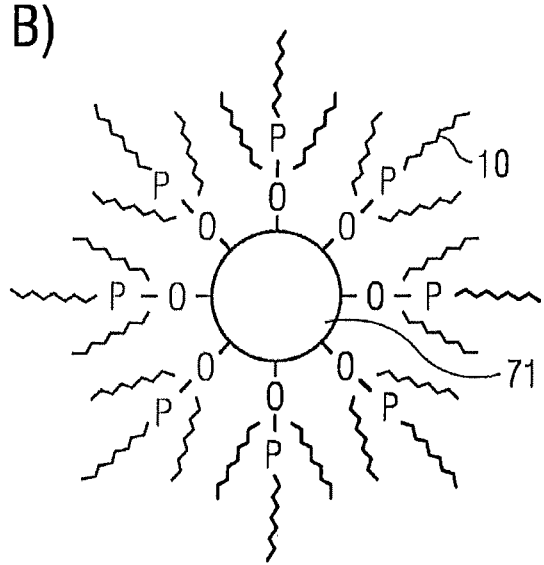
Figure 3:
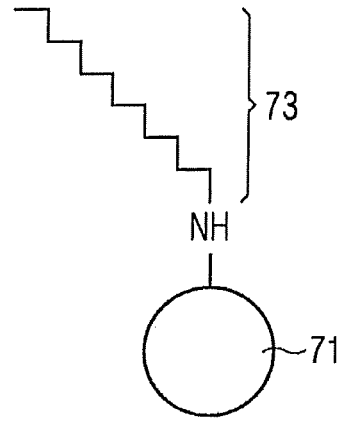

FIG. 3A shows a method of producing an outcoupling element according to an example. In this example, a highly refractive quantum dot 7, for example, gallium phosphide is encapsulated in silica and thus its introducibility or solubility into a matrix material 8, for example, made of silicone is increased. In the first step, quantum dots 7 having a core 71 are provided. The core 71 can, for example, be made of gallium phosphide. The quantum dots 7 are loaded with ligands 73. For example, the ligands have hydroxide groups 73 and are bonded to the surface of the cores of the quantum dots 7. Alternatively, the hydroxide-functionalized ligands can also be exchanged with silanols. This can be done, for example, by hydrophilic substitution. Subsequently, a covalent crosslinking, i.e., a condensation reaction, of the quantum dots can be carried out via a silica network. The quantum dots 7 encapsulated or introduced in silica can subsequently be introduced well into a matrix material, for example, made of silicone.

FIGS. 3B and 3C show quantum dots according to one example. FIG. 3B shows a core 71 of a quantum dot 7 loaded with trioctylphosphine oxide. Trioctylphosphine oxide forms in particular the first ligand shell. Trioctylphosphine oxide can be introduced as stabilizing reagent 10. The first ligand shell is, however, poorly dispersible in a matrix material, for example, made of silicone.

FIG. 3C shows a core 71 of a quantum dot 7 loaded with a first or a second ligand shell 73. This is an amine-functionalized radical arranged on the surface of the cores of the quantum dots 7.

FIGS. 4A to 4F each show a schematic side view of an optoelectronic component 100 according to an example.

Figure 4:
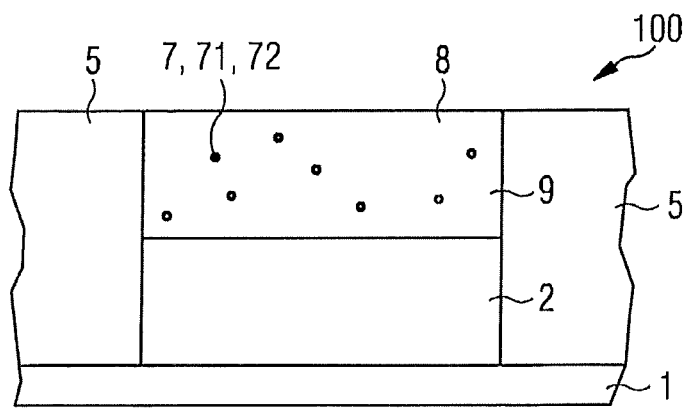
FIGS. 4A to 4F each show a schematic side view of an optoelectronic component according to an example.
Figure 4:
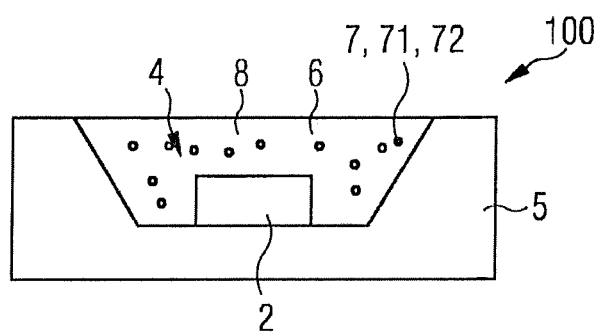
Figure 4:
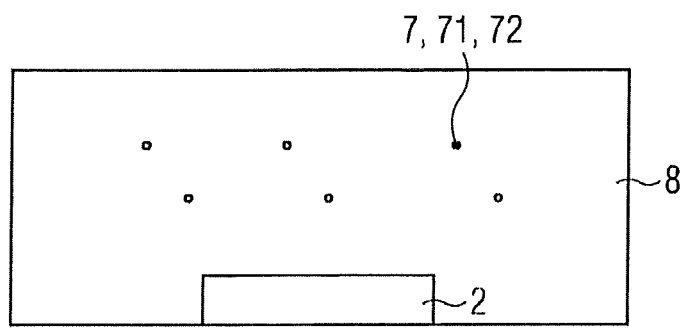
Figure 4:
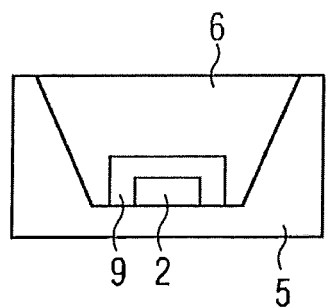
Figure 4:
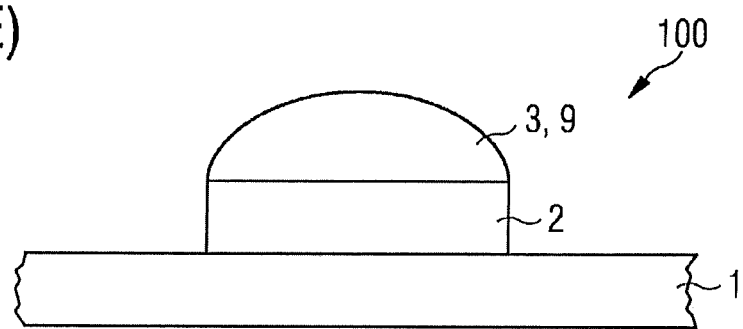
Figure 4:
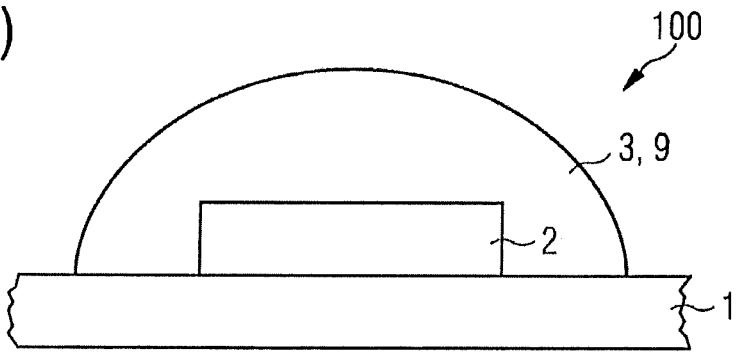

FIG. 4A shows an optoelectronic component 100 having a substrate 1 on which a semiconductor chip 2 is arranged.

According to at least one example of the semiconductor chip 2, it preferably comprises III-V compound semiconductor material. The semiconductor material is preferably a nitride compound semiconductor material such as $Al_n In_{1-n-m} Ga_m N$ or else a phosphide compound semiconductor material $Al_n In_{1-n-m} Ga_m P$, wherein $0 \leq n \leq 1$, $0 \leq m \leq 1$ and $n+m \leq 1$. The semiconductor material can likewise be $Al_x Ga_{1-x} As$ where $0 \leq x \leq 1$. The semiconductor layer sequence can have dopants as well as additional constituents. For the sake of simplicity, however, only the essential components of the crystal lattice of the semiconductor layer sequence are specified, i.e., Al, As, Ga, In, N or P, even if they can be partially replaced and/or supplemented by small quantities of further substances.

In the beam path of the semiconductor chip 2, an outcoupling element 9 is arranged that contains quantum dots 7 having a core 71 and an inorganic or phosphonate-containing ligand shell 72. The quantum dots 7 are introduced into a matrix material 8. The matrix material 8 is in particular a highly refractive silicone, preferably a phenylsilicone. A housing 5 is applied to the side faces of the semiconductor chip 2 and the outcoupling element 9. The housing 5 can additionally comprise scattering particles, for example, titanium dioxide particles or zirconium dioxide particles.

FIG. 4B shows an optoelectronic component 100 with a housing 5. The housing 5 has a recess 4 in which a semiconductor chip 2 is arranged. The semiconductor chip 2 is surrounded on all sides by a casting 6. The casting 6 surrounds both the radiation emission surface and the side surfaces of the radiation-emitting semiconductor chip 2. The casting 6 comprises the matrix material 8 and the quantum dots 7. The quantum dots 7 have a core 71 and an inorganic or a phosphonate-containing ligand shell 72.

FIG. 4C shows an outcoupling element 9 with a matrix material 8 and the quantum dots 7 surrounding the semiconductor chip 2 on all sides.

FIG. 4D shows the configuration of the outcoupling element 9 as a layer surrounding both the side surfaces and the radiation emission surface of the semiconductor chip 2. The semiconductor chip 2 can be arranged in a recess of a housing 5 and can additionally be cast with a casting 6, for example, made of silicone or epoxy.

FIG. 4E shows a substrate 1 on which a semiconductor chip 2 is applied. The outcoupling element 9 is applied in the beam path of the semiconductor chip 2, which is designed in the form of a lens 3. The lens 3 does not project beyond the side surfaces of the semiconductor chip 2.

FIG. 4F differs from the optoelectronic component 100 of FIG. 4E, in that the lens 3 projects beyond the side surfaces of the semiconductor chip 2. In particular, the lens 3 is arranged on the substrate 1 at least in regions. The lens 3 is formed by the outcoupling element 9.

The examples described in conjunction with the figures and the features thereof can also be combined with one another in accordance with further examples. Even if such combinations are not explicitly shown in the figures. Furthermore, the examples described in conjunction with the figures can have additional or alternative features according to the general description.

This disclosure is not restricted to the examples by the description. Rather, the disclosure includes any new feature and also any combination of features that includes in particular any combination of features in the appended claims, even if the feature or combination itself is not explicitly specified in the claims or examples.

This application claims priority of DE 10 2016 117 885.3, the subject matter of which is incorporated herein by reference.

The invention claimed is:

1. A method of producing an outcoupling element for an optoelectronic component comprising:
    A) providing quantum dots each having a core made of a semiconductor material,
    B) applying an inorganic or a phosphonate-containing ligand shell on a respective core of the quantum dots, and
    C) introducing the quantum dots with the ligand shell into a matrix material, wherein introducibility of the quantum dots with the ligand shell is facilitated compared to the quantum dots produced in step A), and the outcoupling element is transparent for radiation from the red and/or IR region.

2. The method according to claim 1,
    wherein the quantum dots in step A) have a first ligand shell different from the inorganic or phosphonate-containing ligand shell,
    in step B), the first ligand shell is exchanged by the inorganic or phosphonate-containing ligand shell, and
    the quantum dots having the first ligand shell have a smaller refractive index than the quantum dots having the inorganic or phosphonate-containing ligand shell.

3. The method according to claim 1, wherein the quantum dots produced in step A) are produced by hot injection and the semiconductor material is selected from the group consisting pf GaP, InP, GaAs and InGaAlP.

4. The method according to claim 1, wherein the quantum dots produced in step A) are produced by hot injection and the semiconductor material comprises GaP.

5. The method according to claim 1, wherein trioctylphosphine oxide is added as a stabilizing reagent.

6. The method according to claim 1, wherein the quantum dots produced in step A) have the core and a first ligand shell which is organic and different from the inorganic or phosphonate-containing ligand shell, and introducibility of the quantum dots with the inorganic or phosphonate-containing ligand shell is facilitated compared to the quantum dots having the first ligand shell.

7. The method according to claim 1, wherein a proportion of quantum dots in the matrix material is 20 vol % to 35 vol %.

8. The method according to claim 1, wherein the quantum dots having the first ligand shell have a lower refractive index than the quantum dots having the inorganic or phosphonate-containing ligand shell.

9. The method according to claim 1, wherein the refractive index of the quantum dots having the inorganic or phosphonate-containing ligand shell is higher than the refractive index of the matrix material.

10. The method according to claim 1, wherein the matrix material is a polyorganosiloxane.

11. The method according to claim 1, wherein the matrix material is a highly refractive poly-methyl-phenyl-siloxane or polydiphenylsiloxane.

12. The method according to claim 1, wherein the inorganic ligand shell has terminal OH or $NH_2$ groups and the quantum dots are embedded in silica prior to step C).

13. The method according to claim 1, wherein the phosphonate-containing ligand shell has a terminal phenyl-functionalized siloxane-phosphonate covalently bonded to the core of the quantum dots.

14. The method according to claim 1, wherein the quantum dots in step A) are produced by direct hot injection, $Ph_3Si$-PDPS or PDMS analogue is added as stabilizing reagent, and the PDMS analogue has structural formula:

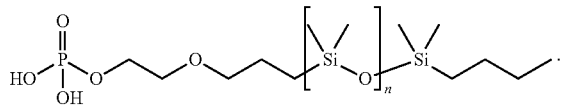

with n ≥ 1

15. An outcoupling element comprising:

a matrix material which is a highly refractive silicone and in which quantum dots each having a core of GaP or InP are embedded, wherein a respective core has a ligand shell of silica or phenyl-functionalized siloxane-phosphonate, and the outcoupling element is transparent to radiation from the red and/or IR region.

16. The outcoupling element according to claim 15, having quantum dots with the core and the ligand shell of formula:

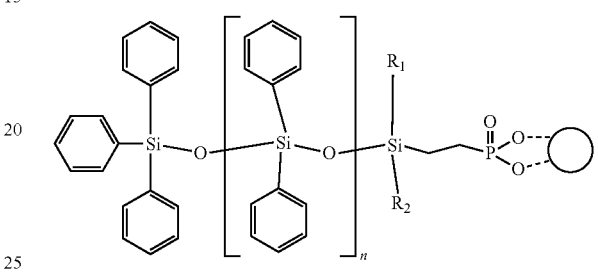

wherein n>1, R1 and/or R2 are independently from one another H, alkyl or aryl, or the ligand shell of the quantum dots has structural formula:

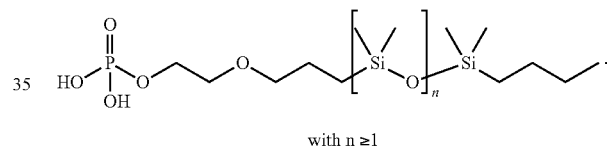

with n ≥ 1

* * * * *